United States Patent
Yoon et al.

(10) Patent No.: US 7,638,794 B2
(45) Date of Patent: *Dec. 29, 2009

(54) ORGANOELECTROLUMINESCENT DEVICE HAVING A SUBSTRATE, A NEGATIVE ELECTRODE, AN ORGANIC ELECTROLUMINESCENT LAYER, A BUFFER LAYER CONTAINING AN ADHESION-INCREASING PORPHYRINIC COMPOUND AND A CATHODE ELECTRODE

(75) Inventors: Jong Geun Yoon, Seoul (KR); Myung Seop Kim, Kyungki-do (KR); Hyoung Yun Oh, Seoul (KR); Sung Tae Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/654,457

(22) Filed: Sep. 4, 2003

(65) Prior Publication Data

US 2004/0104397 A1 Jun. 3, 2004

Related U.S. Application Data

(63) Continuation of application No. 09/848,282, filed on May 4, 2001, now Pat. No. 6,663,985, and a continuation of application No. 09/178,515, filed on Oct. 26, 1998, now Pat. No. 6,248,458.

(30) Foreign Application Priority Data

| Nov. 17, 1997 | (KR) | .................................... 97-60534 |
| May 20, 1998 | (KR) | .................................... 98-18193 |
| Sep. 9, 1998 | (KR) | .................................... 98-37215 |

(51) Int. Cl.
- H01L 29/08 (2006.01)
- H01L 35/24 (2006.01)
- H01L 51/00 (2006.01)

(52) U.S. Cl. .......................... 257/40; 257/642; 257/759; 257/E51.022; 428/917

(58) Field of Classification Search .................... 257/40, 257/59, 72, 79, E51.001–51.052, E25.008–25.009; 313/502–506; 428/690, 917, 332

See application file for complete search history.

(56) References Cited

U.S. PATENT DOCUMENTS 4,356,429 A * 10/1982 Tang ........................... 313/503

(Continued)

FOREIGN PATENT DOCUMENTS

JP 406172665 * 6/1994

(Continued)

OTHER PUBLICATIONS

Copy of European Search Report.

(Continued)

*Primary Examiner*—Monica Lewis
(74) *Attorney, Agent, or Firm*—KED & Associates, LLP

(57) ABSTRACT

A semiconductor device with a substrate, a first electrode on the substrate, at least one of an injection layer or a transporting layer on the first electrode, an adhesion layer on the at least one of an injection layer or a transporting layer, and a second electrode on the adhesion layer.

6 Claims, 2 Drawing Sheets

U.S. PATENT DOCUMENTS

| | | | | |
|---|---|---|---|---|
| 5,227,252 | A | 7/1993 | Murayama et al. | 428/690 |
| 5,281,489 | A | 1/1994 | Mori et al. | 428/690 |
| 5,516,577 | A | 5/1996 | Matsuura et al. | 428/212 |
| 5,593,788 | A | 1/1997 | Shi et al. | 428/690 |
| 5,616,427 | A | 4/1997 | Tada | 428/690 |
| 5,677,571 | A | 10/1997 | Shirai | 257/734 |
| 5,677,572 | A * | 10/1997 | Hung et al. | 257/750 |
| 5,683,823 | A * | 11/1997 | Shi et al. | 428/690 |
| 5,739,635 | A * | 4/1998 | Wakimoto | 313/504 |
| 5,932,363 | A * | 8/1999 | Hu et al. | 428/690 |
| 6,130,001 | A * | 10/2000 | Shi et al. | 428/690 |
| 6,137,223 | A * | 10/2000 | Hung et al. | 428/690 |
| 6,172,459 | B1 | 1/2001 | Hung et al. | 313/506 |
| 6,248,458 | B1 | 6/2001 | Yoon et al. | 313/506 |
| 6,469,437 | B1 | 10/2002 | Parthasarathy et al. | 313/504 |
| 2004/0104397 | A1 | 6/2004 | Yoon et al. | 257/98 |
| 2005/0074628 | A1 * | 4/2005 | Yoon et al. | 428/690 |

FOREIGN PATENT DOCUMENTS

| | | |
|---|---|---|
| JP | 07-331237 | 12/1995 |
| JP | 08-199161 | 8/1996 |
| JP | 09-045479 | 2/1997 |
| JP | 09-199278 | 7/1997 |
| JP | 09-268283 | 10/1997 |

OTHER PUBLICATIONS

Japanese Office Action dated Dec. 19, 2006.

* cited by examiner

ORGANOELECTROLUMINESCENT DEVICE HAVING A SUBSTRATE, A NEGATIVE ELECTRODE, AN ORGANIC ELECTROLUMINESCENT LAYER, A BUFFER LAYER CONTAINING AN ADHESION-INCREASING PORPHYRINIC COMPOUND AND A CATHODE ELECTRODE

This application is a continuation application of U.S. application Ser. No. 09/848,282, filed May 4, 2001 (now U.S. Pat. No. 6,663,985), which is a continuation application of U.S. application Ser. No. 09/178,515, filed Oct. 26, 1998 (now U.S. Pat. No. 6,248,458), which claims priority from Korean Application No. 60534/1997, filed Nov. 17, 1997, Korean Application No. 18193/1998, filed May 20, 1998 and Korean Application No. 37215/1998, filed Sep. 9, 1998, the subject matters of which are incorporated herein by reference.

BACKGROUND OF THE INVENTION

1. Field of the Invention

The present invention relates to a semiconductor device.

2. Background of the Related Art

Semiconductor devices can include many different forms. One form allows electricity to be transformed into light by applying the light to a luminescent material.

Referring to FIG. 1, a related art semiconductor device is shown with a first electrode 2 formed 20 on a transparent substrate 1, a hole injecting layer (HIL) 3 and a hole transporting layer (HTL) 4 formed on the first electrode 2, a luminescent layer 5 formed on the HTL 4, an electron transporting layer (ETL) 6 and an electron injecting layer (EIL) 7 formed on the luminescent layer 5, and a second electrode 8 formed on the EIL 7. Any one or more of HIL 3, HTL 4, ETL 6 and EIL 7 may be omitted, depending on the particular device structure adopted.

Electrons and holes injected into the luminescent layer through the second electrode 8 and the first electrode 2, respectively, recombine to decay radiatively. For most semiconductor devices, the charge injection barrier is higher for electrons than for holes. It is well known that the electron injection barrier may be lowered by employing a low work function material for the second electrode 8. However, low work function materials are chemically reactive, which makes it difficult to use such materials for electrodes. Accordingly, such materials are often used as a second electrode after being alloyed with one of more stable materials, as seen in the examples of Mg:Ag and Al:Li. However, such alloyed second electrodes are still less stable, more costly to form, and more difficult to deposit in a uniform film as compared to aluminum.

An even more serious problem often encountered with an alloyed second electrode of Mg:Ag or Al:Li is the frequent occurrence of cross talk or current leakage between pixels, which may be attributed to the diffusion of Mg or Li ions across organic layers of the device. This problem can be greatly alleviated if one selects aluminum as a second electrode material. However, in the case of aluminum there is a need to improve its poor electron injecting capability. The electron injecting capability of a high work function second electrode, such as aluminum, can be significantly enhanced by inserting a very thin layer (typically 0.3 nm to 1.0 nm) of an electrically insulating material such as LiF, $MgF_2$ or $Li_2O$, inserted either between an aluminum electrode and the luminescent layer, or between the aluminum electrode and the ETL (see, for example, IEEE Transactions on Electronic Devices, Vol. 44, No. 8, p 1245-1248(1997), the contents of which are incorporated herein in their entirety).

$Li_2O$ is a particularly interesting material, in this regard, in that it is an electrically insulating material with a very low work function. The work function of alkali metals themselves is very low, and it becomes even lower when oxidized: for example, work function decreases from 2.1 eV for Cs to about 1 eV for $Cs_2O$ Various alkali metal compounds have reportedly been used to form an insulating buffer layer for the purpose of lowering the electron injecting barrier: e.g., $Li_2O$, $LiBO_2$, NaCl, KCl, $K_2SiO_3$, RbCl, and $Cs_2O$ to name a few.

Despite this improvement, the introduction of the insulating buffer layer poses a challenging new problem, namely, deterioration of adhesion between an EL multilayer and aluminum, with consequent reduction of life time of the device. Experimental results reveal evidence of poor adhesion either at the buffer layer/aluminum interface or at the EL multilayer/buffer layer interface. This situation is not unexpected, given the different characteristics of materials involved. In summary, semiconductor devices of the related art have at least two basic drawbacks, namely, poor adhesion and short life time.

The above information is expressly incorporated by reference in its entirety herein where appropriate for appropriate teachings of compositions useful in the invention, as well as additional or alternative details, features and/or technical background.

SUMMARY OF THE INVENTION

An object of the invention is to solve at least the above problems and/or disadvantages and to provide at least the advantages described hereinafter.

An object of the present invention is to provide a semiconductor device with a long life time 20 and have high efficiency.

An object of the present invention is to provide a semiconductor device, including a substrate, a first electrode on the substrate, at least one of an injection layer and a transporting layer on the first electrode, an adhesion layer on the at least one of an injection layer and a transporting layer, and a second electrode on the adhesion layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
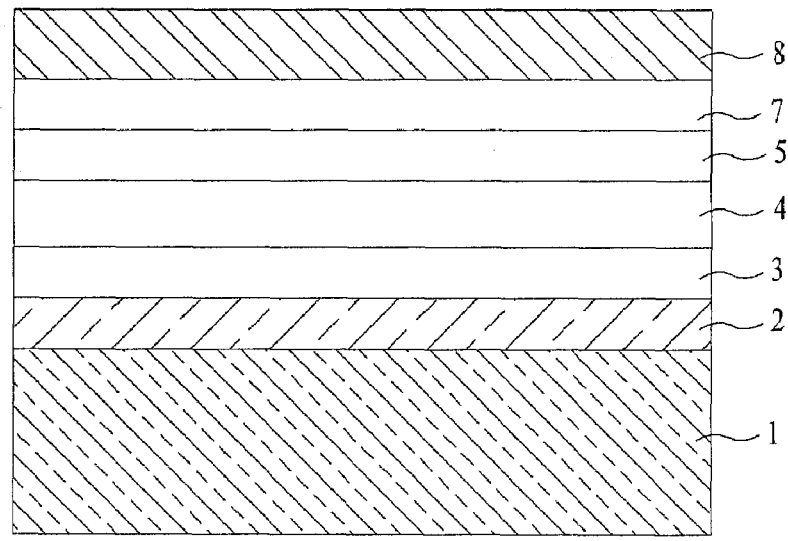
FIG. 1 illustrates a cross-sectional view of a related art semiconductor device; and, FIG. 2 illustrates a cross-sectional view of a semiconductor device in accordance with a preferred embodiment of the present invention.
Figure 2:
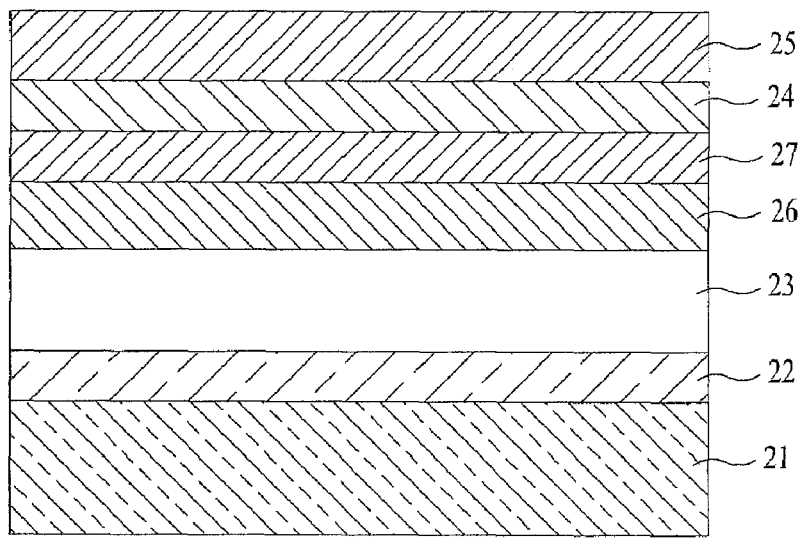
Figure 3:
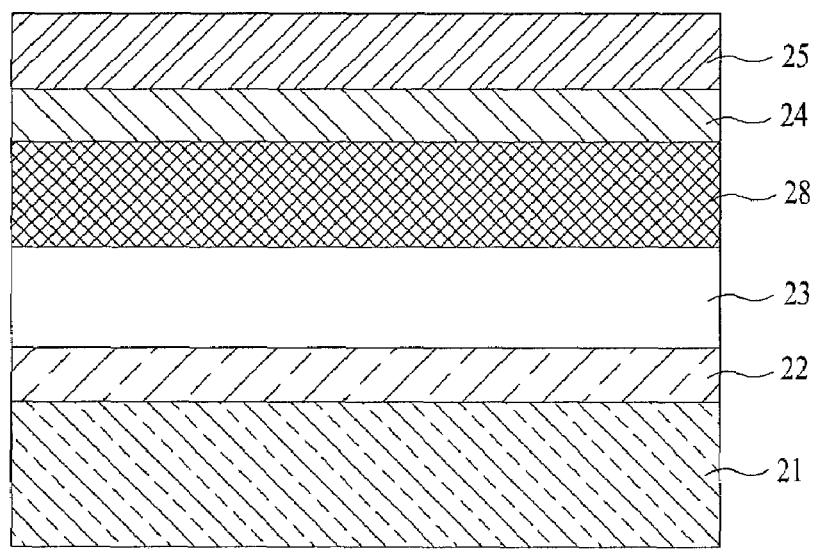
FIG. 3 illustrates a cross-sectional view of a semiconductor device in accordance with a further preferred embodiment of the present invention.
Figure 4:
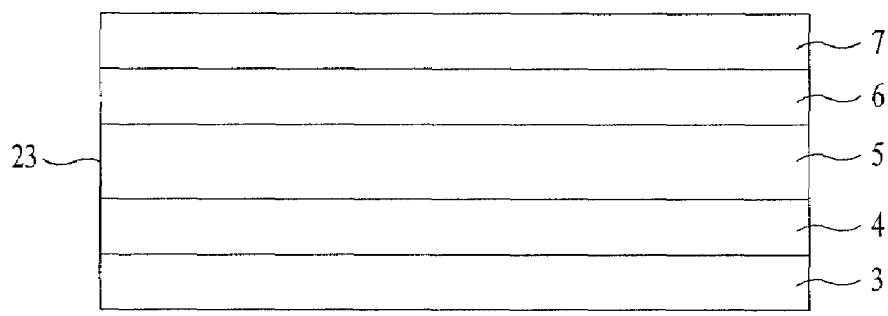
FIG. 4 illustrates a cross-sectional view of an electroluminescent multilayer which may include one or more of a hole injection layer, a hole transporting layer, a luminescent layer, an electron injecting layer, and/or an electron transport layer.

Referring to FIG. 2, the semiconductor device in accordance with a preferred embodiment of the present invention includes a laminated structure of a transparent substrate 21, a first electrode 22, an electroluminescent (EL) multilayer 23 (which may include one or more of a HIL, a HTL, a luminescent layer, an EIL, and/or an ETL, wherein the EL multilayer may be an organic EL multilayer), a second electrode 24, and a protection film 25.

In addition, disposed between the EL multilayer 23 and the second electrode 24 may be a layer I 26 and/or a layer II 27, which primarily serve for improving inter-layer adhesion and electron injection, respectively. The present invention may include only layer I 26, only layer II 27 or include both layer I 26 and layer II 27.

In a preferred embodiment of the invention, layer I can include any material, preferably an adhesive material to increase the adhesion between surrounding layers. More preferably, layer I includes a porphyrinic compound.

Herein, the term EL multilayer may encompass a plurality of layers comprising a luminescent layer and typically one or more of the HIL, HTL, ETL, and EIL. Additionally, the EL multilayer is preferably an organic EL multilayer.

In addition, layer II 27, which may be disposed anywhere in the laminated structure, preferably between the layer I and the second electrode, is designed to improve the electron injection capability and can include any material, preferably at least one material selected from the group consisting of an alkali metal, an alkaline earth metal, and a compound thereof. Exemplary preferred materials for layer II 27 include Li, Cs, $Li_2O$, and LiF. The second electrode 24 is formed of a metal or its alloy, most preferably aluminum.

The semiconductor device of the present invention having the layer I 26 and the layer II 27 10 thus stacked between the EL multilayer 23 and the second electrode 24 shows a substantially prolonged life time as well as a high luminance. The layer I 26 and the layer II 27 may be stacked in the opposite sequence to that shown in FIG. 2, which results in decreased luminance and life time. The layer I 26 and the layer II 27 may have a thickness of from about 0.5 nm to about 50 nm and from about 0.2 nm to about 3 nm, respectively.

According to another aspect of this invention, there is provided a means to improve the life time of a semiconductor device, as well as the electron injecting capability, by inserting, instead of a dual layer of the layer I and the layer II, a mixed layer 28, comprising a mixture of the components of layer I and layer II, wherein the mixed layer is inserted between the EL multilayer and the second electrode. The mixed layer is formed by the co-deposition of (1) at least one first material selected from the group consisting of compounds of chemical formula I and (2) at least one second material selected from the group consisting of an alkali metal, an alkaline earth metal and a compound thereof. The ratio of the first and second materials in the mixed layer can be either fixed or varied as a function of position, i.e., by forming a concentration gradient of the first and second materials within the mixed layer.

Preferably, the mixed layer may have a thickness of from about 0.5 nm to about 10 nm. Exemplary preferred materials comprising layer II 27 include Li, Cs, $Li_2O$, and LiF. The second electrode 24 is formed of a metal or its alloy, most preferably aluminum.

In addition, the layer I may include at least one adhesive compound, preferably a porphyrinic compound, which serves principally to improve the adhesion between the EL multilayer 23 and the second electrode 24, while retaining good electron transporting capability.

Exemplary devices have been fabricated in accordance with the present invention, and their performance has been compared with that of related art devices: the two devices (A and B) are of the related art, and the other two devices (C and D) represent two embodiments of the present invention.

The basic structure of a related art EL device for green emission comprises: (1) a first electrode of indium tin oxide (ITO) 150 nm thick, (2) a buffer layer of copper phthalocyanine (CuPc) typically about 10 nm to about 20 nm thick, (3) a hole transporting layer of N,N'-diphenyl-N,N'-bis(3-methylphenyl)-(1,1'-biphenyl)-4,4'-diamine (TPD) typically 30 nm to 50 nm thick, and (4) an emitting layer of tris(8-hydroxy-quinolate)aluminum ($Alq_3$) typically about 40 nm to about 60 nm thick.

The device A has a second electrode of aluminum formed directly on the EL multilayer (device structure: ITO/CuPc/TPD/$Alq_3$/Al); while the device B has a layer of $Li_2O$ about 1 nm thick between the EL multilayer and the second electrode (device structure: ITO/CuPc/TPD/$Alq_3$/$Li_2O$ (1 nm)/Al). The device C has a structure of ITO/CuPc/TPD/$Alq_3$/CuPc(2 nm)/$Li_2O$(1 nm)/Al, while the device D has a structure of ITO/CuPc/TPD/$Alq_3$/$Li_2O$(1 nm)/CuPc(2 nm)/Al. In short, the layer-forming sequence of $Li_2O$(1 nm) and CuPc(2 nm) is reversed for the devices C and D. Finally, all devices have been encapsulated in an inert atmosphere.

TABLE I lists the voltage measured between a first electrode and a second electrode, luminance, and life time of the device, with each sample device subjected to a constant current density of 3 $mA/cm^2$.

TABLE I

|  | voltage (V) | luminance ($cd/m^2$) | life time |
|---|---|---|---|
| Device A | 6 | 50 | short (less than 1 hour) |
| Device B | 6 | 100 | short (less than 1 hour) |
| Device C | 6 | 150 | long (longer than 2000 hours) |
| Device D | 8 | 130 | intermediate (roughly 100 hours) |

The life time quoted in TABLE 1 represents the time by which luminance drops to half the initial value for each device. It is apparent from TABLE 1 that the devices C and D of the present invention have superior long-term stability as compared with the devices A and B of the related art. This result may be explained as follows: $Li_2O$ shows poor adhesion to both $Alq_3$ and aluminum (e.g., device B). In addition, a 1 nm-thick layer of $Li_2O$ does not form a complete and uniform layer, but rather a type of island structure. As a result, in device C, a part of the CuPc layer is apparently in direct contact with aluminum through voids in the $Li_2O$ layer, which significantly contributes to enhancing the adhesion of the EL/metal interface and consequently the life time of the device, such as device C. The copper ion in CuPc is probably responsible for the relatively strong bonding between CuPc and aluminum. Compared to device C, device D exhibits a higher driving voltage because of the raised electron-injection barrier, due to the presence of CuPc between $Li_2O$ and aluminum, and consequently device D exhibits a shorter life time due to the increased electrical and thermal stress.

According to another embodiment of the invention, there is provided a means to improve the life time as well as the electron injecting capability of a semiconductor device, by inserting, instead of a dual layer of the layer I 26 and the layer II 27 in FIG. 2, a mixed layer comprising layer I 26 and layer II 27 between the EL multilayer and the second electrode.

The mixed layer is formed by the co-deposition of (1) a first material, which preferably includes at least one porphyrinic compound; and (2) a second material comprising at least one of an alkali metal, an alkaline earth metal, and/or a compound thereof. The use of the mixed layer improves adhesion, but deteriorates electron injection slightly. The mixing ratio between the two groups of materials can be fixed throughout the layer, or varied as a function of position (i.e., to form a concentration gradient of the components within the layer).

According to a preferred embodiment, the mixed layer has a concentration gradient wherein: (1) the relative concentration of the second material comprising at least one of an alkali metal, an alkaline earth metal, and compounds thereof is zero at the interface with the EL multilayer, and unity at the interface with the second electrode, and varying gradually in between; and (2) the relative concentration of the first material, preferably including porphyrinic compounds is unity at the interface with the EL multilayer, and zero at the interface with the second electrode, and varying gradually in between. The thickness of the mixed layer is preferably in the range of from about 0.5 nm to about 10 nm.

Advantages of semiconductor devices of the present invention include the following: The insertion of either a dual layer of layer I 26 and layer II 27, or a mixture of the two layers between the EL multilayer and the second electrode leading to significant improvements in the long-term stability as well as the luminance of a semiconductor device, wherein layer I 26 comprises an adhesive material, and layer II 27 preferably includes at least one of an alkali metal, an alkaline earth metal, and/or a compound thereof.

U.S. Pat. No. 6,248,458 B1 is hereby incorporated herein by reference in its entirety. The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An organic electroluminescent device comprising:
   a substrate;
   a first electrode on the substrate;
   an organic electroluminescent layer on the first electrode;
   a mixed layer on the organic electroluminescent layer, the mixed layer including a first material having at least one of an alkali metal, an alkaline earth metal, or a compound thereof, and a second material having an adhesive material for increasing adhesion between the mixed layer and the organic electroluminescent layer;
   a second electrode on the mixed layer;
   wherein a concentration gradient of the first material is zero at an interface between the organic electroluminescent layer and the layer, mixed and the concentration gradient of the material increases gradually in a direction of an interface between the mixed layer and the second electrode, and a concentration gradient of the second material is zero at the interface between the mixed layer and the second electrode, and the concentration gradient of the second material increases gradually in the direction of the interface between the organic electroluminescent layer and the mixed layer.

2. An organic electroluminescent device comprising;
   a substrate;
   a first electrode on the substrate;
   an organic electroluminescent layer on the first electrode, the organic electroluminescent layer includes a hole injection layer (HIL), a hole transporting layer (HTL), an electron transporting layer (ETL), and an electron injection layer (EIL);
   a mixed layer on the organic electroluminescent layer, the mixed layer including a first material having at least one of an alkali metal, an alkaline earth metal, or a compound thereof, and a second material having an adhesive material for increasing adhesion between the mixed layer and the organic electroluminescent layer;
   a second electrode on the mixed layer;
   wherein a concentration gradient of the first material is zero at an interface between the organic electroluminescent layer and the mixed layer, and the concentration gradient of the first material increases gradually in a direction of an interface between the mixed layer and the second electrode, and a concentration gradient of the second material is zero at the interface between the mixed layer and the second electrode, and the concentration gradient of the second material increases gradually in the direction of the interface between the organic electroluminescent layer and the mixed layer.

3. The organic electroluminescent device of claim 2, wherein the mixed layer is provided between the organic electroluminescent layer and the second electrode.

4. The organic electroluminescent device of claim 3, wherein the first electrode is provided between the substrate and the organic electroluminescent layer.

5. The organic electroluminescent device of claim 1, wherein the mixed layer is provided between the organic electroluminescent later and the second electrode.

6. The organic electroluminescent device of claim 5, wherein the first electrode is provided between the substrate and the organic electroluminescent layer.

* * * * *